(12) United States Patent
Chen

(10) Patent No.: US 7,344,385 B2
(45) Date of Patent: Mar. 18, 2008

(54) POWER SUPPLY DEVICE

(75) Inventor: Wei-Hsi Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/611,147

(22) Filed: Dec. 15, 2006

(65) Prior Publication Data

US 2007/0249187 A1    Oct. 25, 2007

(30) Foreign Application Priority Data

Apr. 21, 2006    (TW) .................................. 95114370

(51) Int. Cl.
*H01R 12/00*    (2006.01)

(52) U.S. Cl. .................... 439/74; 439/171; 439/131

(58) Field of Classification Search ................ 439/761, 439/131, 74, 171–174, 76, 856, 876, 140, 439/137, 353, 176; 361/331, 380, 386, 395, 361/399–400, 791, 785, 822, 823, 752, 728, 361/807, 819
See application file for complete search history.

(56) References Cited

U.S. PATENT DOCUMENTS

| | | | |
|---|---|---|---|
| 4,519,015 A * | 5/1985 | Lin ............................. | 361/752 |
| 5,494,449 A * | 2/1996 | Chioo ....................... | 439/76.1 |
| 6,312,271 B1 | 11/2001 | Tseng | |
| 6,790,102 B2 * | 9/2004 | Stillabower et al. ........ | 439/856 |
| 7,104,818 B1 * | 9/2006 | Chang ........................ | 439/140 |

* cited by examiner

*Primary Examiner*—Edwin A. Leon
(74) *Attorney, Agent, or Firm*—Wei Te Chung

(57) ABSTRACT

A power supply device (10) includes a case (30), a circuit board (50), a plurality of conductive terminals (60), and a plurality of securing members (40). The case includes a bottom plate (32). Each terminal is embedded in the bottom plate and includes a first end portion (66) extending into the case, and a second end portion (64) extending out of the case. The first end portion includes at least one receiving portion (62) disposed on a distal end thereof. Each securing member is mounted on the circuit board and includes at least one protrusion (48) received in the corresponding receiving portion.

9 Claims, 5 Drawing Sheets

_US 7,344,385 B2_

POWER SUPPLY DEVICE

BACKGROUND OF THE INVENTION

1. Field of the Invention

The present invention pertains to power supply devices, and particularly to a power supply device being easily assembled and disassembled.

2. Description of Related Art

Electronic devices, such as access points, mobile phones, notebooks, and so on, are becoming ever more popular. In these electronic devices, the main function of the power supply device is to supply power to the electronic devices, and thus the power supply device is a necessary unit.

A typical power supply device includes a case, a pair of conductive terminals, and a circuit board received in the case. The terminals are electrically connected to the circuit board by a soldering process. However, when circuits or electronic components in the power supply device require maintenance, it is necessary to unsolder the terminals from the circuit board, and then resolder the terminals to the circuit board after maintenance, thereby increasing the cost of maintenance.

Another typical power supply device utilizes a plurality of metal lines or wires to electrically connect the terminals to the circuit board. However, soldering and unsoldering of the metal lines is still required to perform maintenance.

Therefore, a heretofore unaddressed need exists in the industry to overcome the aforementioned deficiencies and inadequacies.

SUMMARY OF THE INVENTION

In an exemplary embodiment, a power supply device includes a case, a circuit board, a plurality of conductive terminals, and a plurality of securing members. The case includes a bottom plate. Each terminal is embedded in the bottom plate and includes a first end portion extending into the case, and a second end portion extending out of the case. The first end portion includes at least one receiving portion disposed on a distal end thereof. Each securing member is mounted on the circuit board and includes at least one protrusion received in the corresponding receiving portion.

Other advantages and novel features will become more apparent from the following detailed description of preferred embodiments when taken in conjunction with the accompanying drawings, in which:

DETAILED DESCRIPTION OF THE INVENTION

Figure 1:
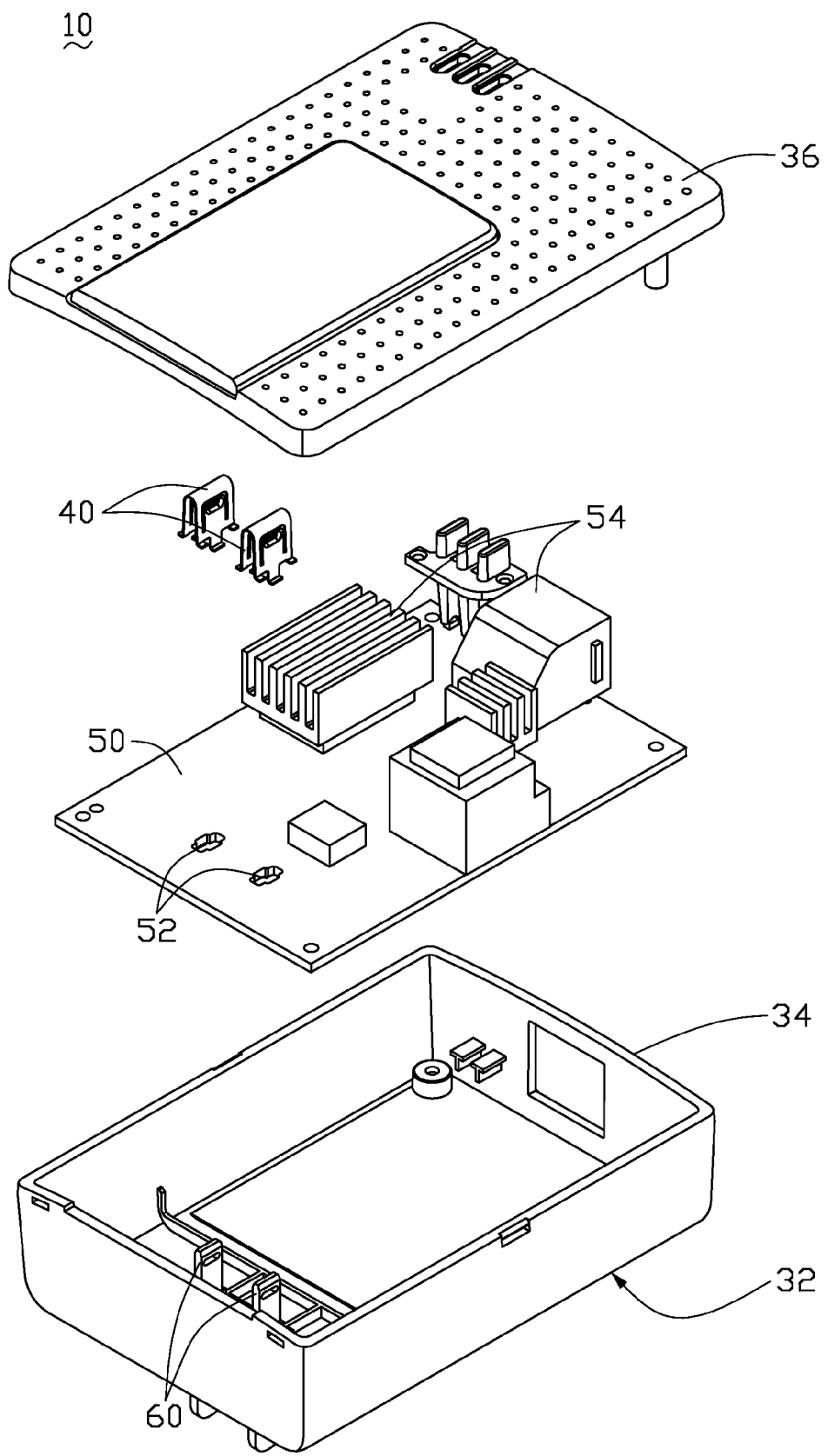
FIG. 1 is an exploded, isometric view of a power supply device of an exemplary embodiment of the present invention.
Figure 3:
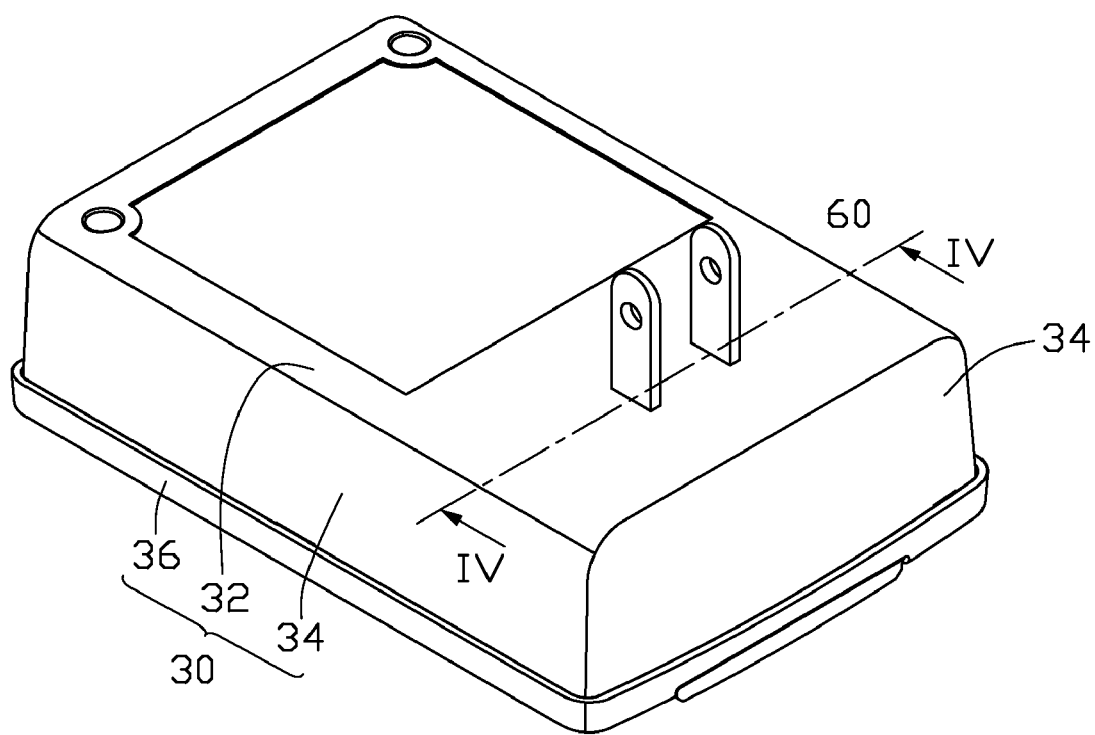
FIG. 3 is an inverted assembled view of FIG. 1.

Referring to FIGS. 1 and 3, a power supply device 10 of an exemplary embodiment of the present invention comprises a case 30, a circuit board 50, a pair of conductive terminals 60, and a pair of securing members 40.

The case 30 comprises a bottom plate 32, a plurality of side walls 34, and a cover 36. The side walls 34 are perpendicularly connected to the bottom plate 32. The side walls 34 and the bottom plate 32 are integrally formed by mold-forming technology. The cover 36 is mounted to the bottom plate 32 and the side walls 34.

Figure 2:
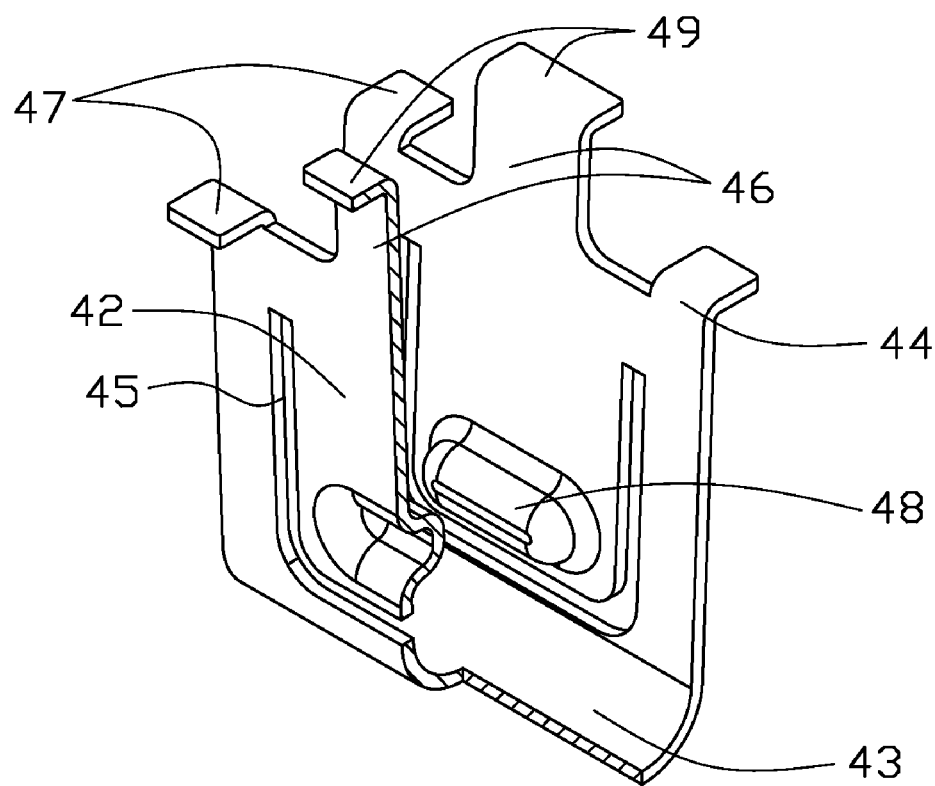
FIG. 2 is an enlarged, inverted, and partly cut-away isometric view of a securing member of the power supply device of FIG. 1.

Referring to FIG. 2, The securing members 40 are mounted on the circuit board 50. Each securing member 40 is generally u-shaped so as to define a receiving space in the securing member 40. Opposing arms of the u-shape are a pair of clipping portions 42, and a base of the u-shape is a connecting portion 43. The distance between the pair of the clipping portions 42 is generally equal to a width of the terminal 60. Each clipping portion 42 comprises a protrusion 48 protruding toward the opposite clipping portion 42, and defines a U-shaped hole 45 partly surrounding the protrusion 48, thus reinforcing the clipping portion 42. A distal end of each of the clipping portions 42 of the securing members 40 comprises a pair of first mounting tabs 44, and a second mounting tab 46. The second mounting tabs 46 are respectively disposed between the first mounting tabs 44. Each first mounting tab 44 comprises a first fixing portion 47 bent from a distal end thereof. Each second mounting tab 46 comprises a second fixing portion 49 bent from a distal end thereof. A length of the second mounting tab 46 is greater than a length of the first mounting tab 44. The difference between the lengths of the first mounting tab 44 and the second mounting tab 46 is equal to the thickness of the circuit board 50.

Figure 5:
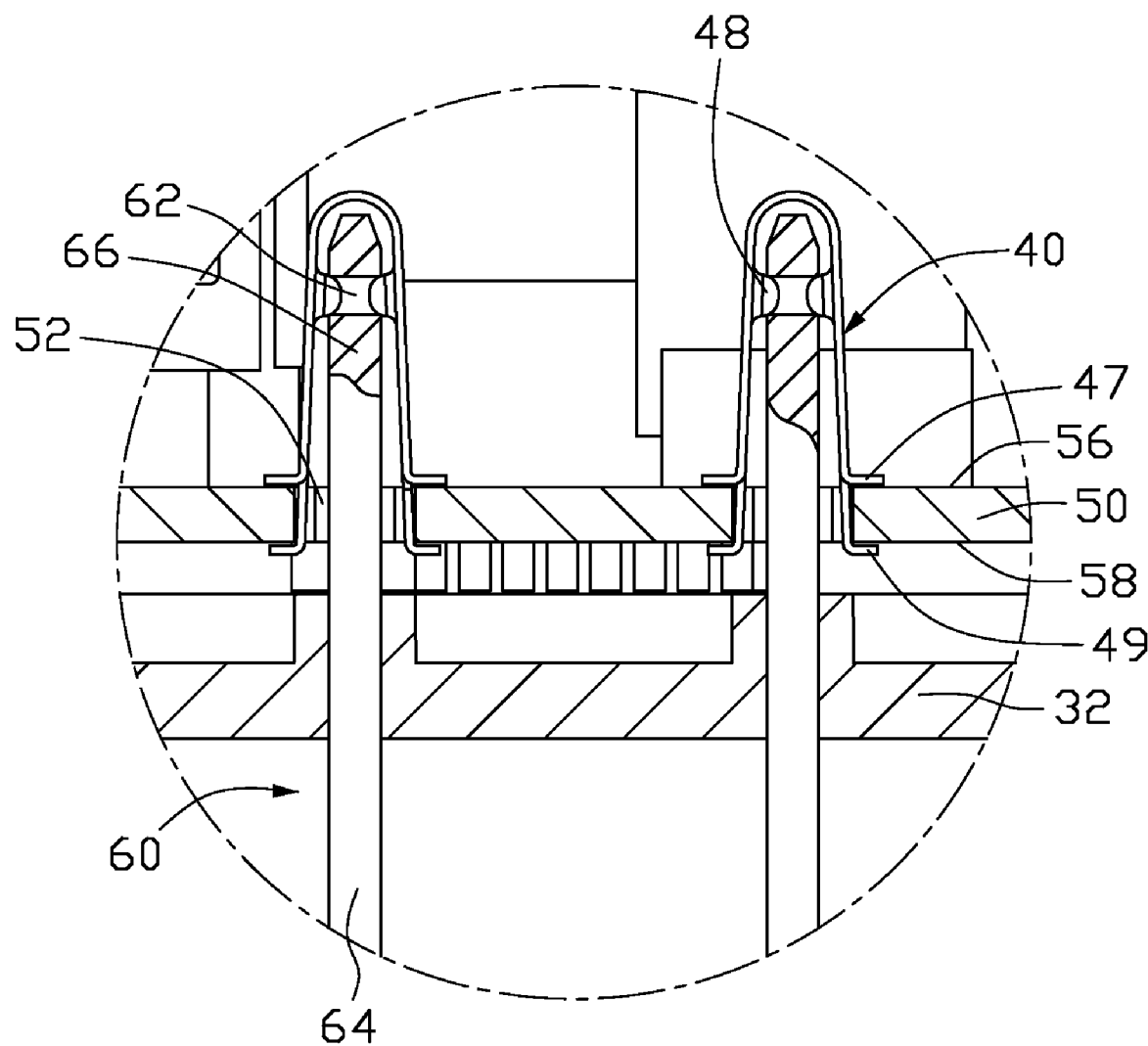
FIG. 5 is an enlarged view of a circled portion V of FIG. 4.

Referring to FIGS. 1 and 5, the circuit board 50 is received in the case 30. The circuit board 50 comprises a first surface 56, a second surface 58 opposite to the first surface 56, and a plurality of electronic components 54 disposed on the first surface 56 or the second surface 58. The circuit board 50 also defines a pair of receiving holes 52 used for receiving the corresponding second mounting tabs 46.

The terminals 60 are embedded in the bottom plate 32. Each terminal comprises a first end portion 66, a second end portion 68, and a receiving portion 62. The first end portion 66 extends into the case 30, and the second end portion 68 extends out of the case 30. The receiving portion 62 is disposed on a distal end of the first end portion 66, and is used for receiving the corresponding protrusion 48. In the exemplary embodiment, the receiving portion 62 is a through-hole defined in the first end portion 66. In another exemplary embodiment, the receiving portion 62 may be a pair of recesses respectively disposed on opposite surfaces of the first end portion 66.

Figure 4:
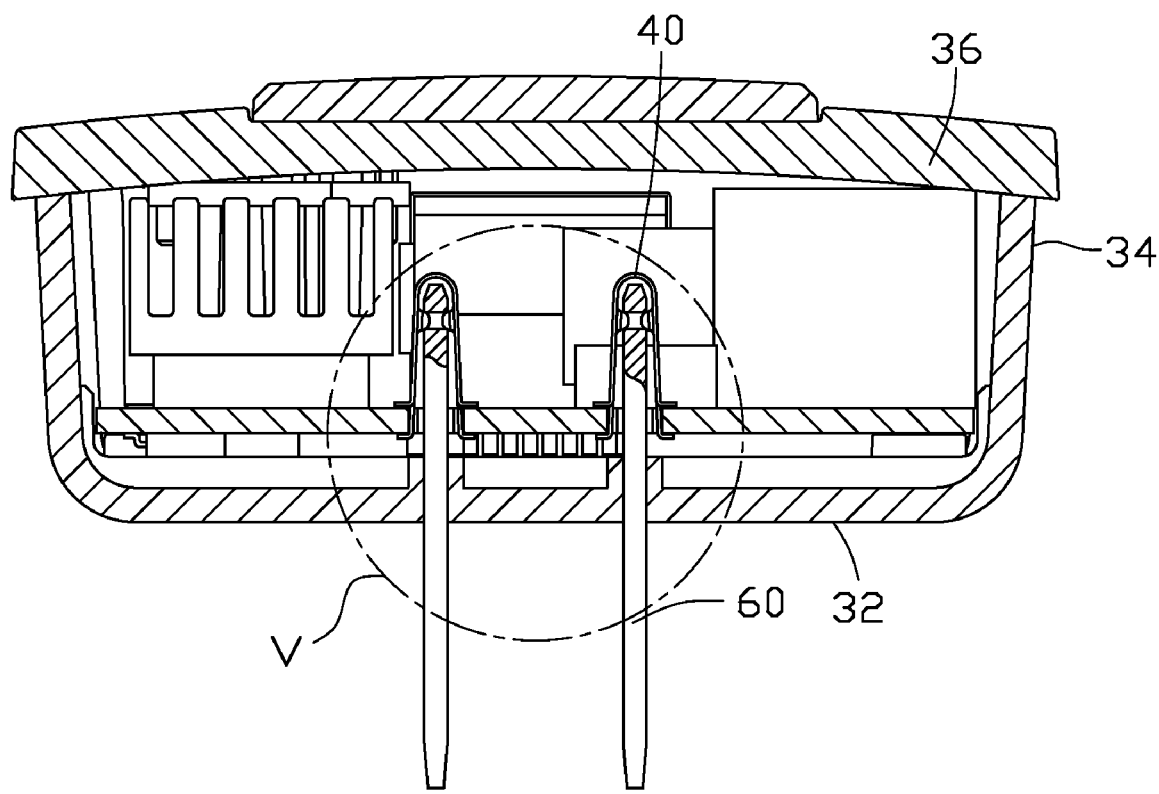
FIG. 4 is a cross-sectional view taken along line IV-IV of FIG. 3.

Referring also to FIGS. 3 and 4, in assembly, the securing members 40 are mounted on the circuit board 50. Each first fixing portion 47 of the securing members 40 is soldered on the first surface 56 thus securing the corresponding first mounting tab 44 on the circuit board 50. Each second mounting tab 46 is received in the corresponding receiving hole 52. Each second fixing portion 49 is soldered on the second surface 58 thus securing the second mounting tab 46 on the circuit board 50. The circuit board 50 is received in the case 30, and is mounted on the bottom plate 32 with screws (not shown). The terminals 60 are embedded in the bottom plate 32. The clipping portions 42 clip the first end portions 66. The protrusions 48 are received in the receiving portions 62 of the first end portions 66. The cover 36 is mounted to the side walls 34 and the bottom plate 32.

In disassembly, the screws securing the circuit board 50 to the bottom plate 32 are removed from the circuit board 50. The protrusions 66 disengage from the receiving portions 62 of the terminals 60. And thus the circuit board 50 with the securing member 40 can be detached from the bottom plate 32.

With the protrusions 48 of the securing members 40 being received in the receiving portions 62 of the terminals 60, and abutting against edges of the receiving portions 62, the terminals 60 electrically connect to the circuit board 50. Furthermore, the terminals 60 can be easily disengaged from the circuit board 50, without unsoldering before maintenance, and can be easily engaged with the circuit board 50 again, without soldering process after maintenance. That is, the power supply device 10 is easily assembled and disassembled, thus facilitating the maintenance of the power supply device 10 and reducing cost of maintenance.

In an alternative embodiment, the number of the terminals 60 of the power supply device 10 may be three, and the number of securing members 40 is equal to the number of the terminals 60.

In another alternative embodiment, the power supply device 10 may be a part of an electronic device, such as a WiFi Repeater.

While exemplary embodiments have been described above, it should be understood that they have been presented by way of example only and not by way of limitation. Thus the breadth and scope of the present invention should not be limited by the above-described exemplary embodiments, but should be defined only in accordance with the following claims and their equivalents.

What is claimed is:

1. A power supply device, comprising:
a case comprising a bottom plate;
a circuit board received in the case, the circuit board comprising a plurality of receiving holes therein;
a plurality of conductive terminals embedded in the bottom plate, each of the conductive terminals comprising a first end portion extending into the case and protruding through the corresponding receiving hole, and a second end portion extending out of the case; and
a plurality of U-shaped securing members extending through the receiving holes, each of the securing members comprising a pair of clipping portions at opposing arms of the U-shape respectively for fixing the conductive terminals therebetween; wherein each opposing arm further comprises at least one first mounting tab and at least one second mounting tab, the at least one first and at least one second mounting tabs extending from distal ends of the clipping portion respectively, each of the at least one first and at least one second mounting tabs comprises at least one fixing portion bent from a distal end thereof, and the circuit board is latched between the fixing portions of the at least one first and at least one second mounting tabs.

2. The power supply device as claimed in claim 1, wherein each securing member further comprises a connecting portion connecting the pair of clipping portions.

3. The power supply device as claimed in claim 1, wherein each of the conductive terminals comprises a receiving portion therein, each of the clipping portions comprises at least one protrusion toward the opposite clipping portion, and when the conductive terminals are latched between the clipping portions, the protrusions are latched in the receiving portions.

4. The power supply device as claimed in claim 3, wherein each clipping portion defines a U-shaped hole partly surrounding the corresponding at least one protrusion, allowing resilient movement of the at least one protrusion relative to the clipping portion.

5. An electronic device, comprising:
a case comprising a bottom plate, a plurality of side walls connected to the bottom plate, and a cover mounted to the bottom plate and the side walls;
a circuit board received in the case, the circuit board comprising a plurality of receiving holes therein;
a plurality of conductive terminals embedded in the bottom plate, each of the conductive terminals comprising a first end portion extending into the case, and a second end portion extending out of the case, the first end portion comprising at least one receiving portion disposed on a distal end thereof; and
a plurality of U-shaped securing members extending through the receiving holes, each of the securing members comprising a pair of clipping portions at opposing arms of the U-shape respectively for fixing the conductive terminals therebetween;
wherein each opposing arm further comprises at least one first mounting tab and at least one second mounting tab, the at least one first and at least one second mounting tabs extending from distal ends of the clipping portions respectively, each of the at least one first and at least one second mounting tabs comprises at least one fixing portion bent from a distal end thereof, and the circuit board is latched between the fixing portions of the at least one first and at least one second mounting tabs.

6. The electronic device as claimed in claim 5, wherein each securing member further comprises a connecting portion connecting the pair of clipping portions.

7. The electronic device as claimed in claim 5, wherein each of the conductive terminals comprises a receiving portion therein, each of the clipping portions comprises at least one protrusion protruding toward the opposite clipping portion, and when the conductive terminals are latched between the clipping portions, the protrusions are latched in the receiving portions.

8. The electronic device as claimed in claim 7, wherein each clipping portion defines a U-shaped hole partly surrounding the corresponding at least one protrusion, allowing resilient movement of the at least one protrusion relative to the clipping portion.

9. An electronic device comprising:
a case enclosing said electronic device;
a circuit board received in said case, said circuit board defining a plurality of receiving holes therein;
a plurality of conductive terminals installable at said case to extend through a side of said case, each of said plurality of conductive terminals comprising a first end portion extending into said case to be reachable to a corresponding one of said receiving holes of said circuit board for extending through said corresponding one of said receiving holes, and a second end portion extending out of said case for further electrical connection therewith; and
a plurality of securing members installable beside said circuit board and electrically connectable with said circuit board, each of said plurality of securing members defining a receiving space therein beside said corresponding one of said receiving holes of said circuit board so that said first end portion of said each of said plurality of conductive terminals extending through said corresponding one of said receiving holes is able to be reachably placed in said receiving space to electrically connect with said circuit board exclusively through said each of said plurality of securing members, said each of said plurality of securing members is U-shaped, and each of opposite arms of said each of said plurality of U-shaped securing member define a clipping portion thereon, a protrusion extends from said clipping portion and toward the other clipping portion defined on the other of opposite arms of said each of said plurality of U-shaped securing member, a U-shaped hole is defined in said clipping portion around said protrusion of said clipping portion so that said protrusion is able to resiliently move relative to said clipping portion due to existence of said U-shaped hole around said protrusion, wherein each opposite arm further comprises at least one first mounting tab and at least one second mounting tab, the at least one first and at least one second mounting tabs extending from distal ends of the clipping portions respectively, each of the at least one first and at least one second mounting tabs comprises at least one fixing portion bent from a distal end thereof, and the circuit board is latched between the fixing portions of the at least one first and at least one second mounting tabs.

* * * * *